(12) United States Patent
Tapscott

(10) Patent No.: US 6,300,378 B1
(45) Date of Patent: Oct. 9, 2001

(54) TROPODEGRADABLE BROMINE-CONTAINING HALOCARBON ADDITIVES TO DECREASE FLAMMABILITY OF REFRIGERANTS FOAM BLOWING AGENTS SOLVENTS AEROSOL PROPELLANTS AND STERILANTS

(75) Inventor: Robert E. Tapscott, Albuquerque, NM (US)

(73) Assignee: University of New Mexico

( * ) Notice: Subject to any disclaimer, the term of this patent is extended or adjusted under 35 U.S.C. 154(b) by 0 days.

(21) Appl. No.: 09/049,787

(22) Filed: Mar. 27, 1998

Related U.S. Application Data

(63) Continuation-in-part of application No. 08/720,112, filed on Sep. 27, 1996, now Pat. No. 5,900,185.

(30) Foreign Application Priority Data

Mar. 28, 1997 (EP) .................................. 97870044

(51) Int. Cl.⁷ .............................. C09K 5/00; A01N 29/00
(52) U.S. Cl. .............................. 514/743; 252/67; 252/68
(58) Field of Search ................................ 514/102, 743, 514/744, 746, 747, 751, 757, 760, 761; 252/67, 68

(56) References Cited

U.S. PATENT DOCUMENTS

| | | | |
|---|---|---|---|
| 2,966,397 | 12/1960 | Darbee et al. ......................... | 23/207 |
| 3,923,967 | 12/1975 | Kirchner et al. ...................... | 423/588 |
| 3,998,937 | 12/1976 | Vaughan ............................... | 423/588 |
| 4,238,551 | * 12/1980 | Lal et al. .............................. | 428/660 |
| 4,374,820 | 2/1983 | Guenter ................................ | 423/588 |
| 5,399,333 | 3/1995 | Kato et al. ............................ | 423/588 |

FOREIGN PATENT DOCUMENTS

| | | |
|---|---|---|
| 1 112 051 | 8/1961 | (DE) . |
| 1 106 737 | 12/1961 | (DE) . |
| 1 195 279 | 6/1965 | (DE) . |
| 0286610 | 12/1988 | (EP) . |
| 0453949 | 10/1991 | (EP) . |
| 0778085 | 6/1997 | (EP) . |
| 1252822 | 11/1971 | (GB) . |

OTHER PUBLICATIONS

Ullman's Encyclopedia of Industrial Chem, 5$^{th}$ Ed. (1989), vol. 413, 447–457.
*Patent Abstracts of Japan* entry for Japanese Laid Open Patent Publication No. 58–180452 to Kawasaki KK dated Oct. 21, 1983.
*Patent Abstracts of Japan* entry for Japanese Laid Open Patent Publication No. 59–51235 to Kawasaki KK dated Mar. 24, 1984.

* cited by examiner

*Primary Examiner*—S. Mark Clardy
*Assistant Examiner*—Alton Pryor
(74) *Attorney, Agent, or Firm*—Robert W. Becker & Associates

(57) ABSTRACT

A set of tropodegradable chemical additives to decrease the flammability of normally flammable refrigerants, foam blowing agents, cleaning solvents, aerosol propellants, and sterilants is disclosed. The additives are characterized by high efficiency and short atmospheric lifetimes. The latter property is essential and results in a low ozone depletion potential (ODP) and a low global warming potential (GWP). The additives are bromine-containing alkenes, bromine-containing alcohols, bromine-containing ethers with at least one hydrogen atom (preferably adjacent to the oxygen atom), bromine-containing amines with at least one hydrogen atom (preferably adjacent to the nitrogen atom), bromine-containing carbonyl compounds, bromine-containing aromatics, and/or bromine-containing non-fluorinated alkanes.

16 Claims, 1 Drawing Sheet

US 6,300,378 B1

TROPODEGRADABLE BROMINE-CONTAINING HALOCARBON ADDITIVES TO DECREASE FLAMMABILITY OF REFRIGERANTS FOAM BLOWING AGENTS SOLVENTS AEROSOL PROPELLANTS AND STERILANTS

This appln is a CIP of Ser. No. 08/720,112 filed Sep. 27, 1996 now U.S. Pat. No. 5,900,185.

FIELD OF THE INVENTION

The invention described and claimed herein is generally related to bromine-containing halocarbon additives used to decrease or eliminate the flammability of refrigerants, foam blowing agents, cleaning agents (solvents), aerosol propellants, and sterilants. Specific and novel to this invention are the combined properties of these additives: (1) The halocarbon additives claimed are destroyed or otherwise removed rapidly by natural processes in the earth's troposphere and thus have short atmospheric lifetimes, low ozone depletion potentials (ODPs), and low global warming potentials (GWPs). (2) These additives are chemically active flammability reducing agents and do not operate merely by dilution of a flammable substance with a nonflammable substance. In this document, I refer to atmospheric lifetimes, ODPs, and GWPs as "global environmental properties" since they determine the potential environmental impact on the earth as a whole rather than just one area. The additives claimed are called "tropodegradable" since they are removed rapidly from the earth's troposphere.

BACKGROUND

Flammability and Explosivity

It is important at this point to briefly discuss what is meant by flammability and explosivity. Materials used in the applications of interest here (refrigeration, foam blowing, solvents, aerosol propulsion, and sterilization) are liquids or gases. In many cases, they are stored in one form and used in another or they are present in both forms during use. When flammable liquids burn, combustion actually occurs in the vapor phase, which is formed above the surface of the liquid by evaporation of the liquid. When flammable gases or vapor from evaporated flammable liquids are allowed to mix with air, the mixture can be explosive. (In this document, I use the terms "vapor" and "gas" as synonymous.) In fact, for the materials of interest here, explosions are just rapid combustion in the gaseous state. Explosions are often termed "deflagrations" if the combustion is relatively slow and as "detonations" if it is extremely fast. Thus "burning," "combustion," "explosion," "deflagration," and "detonation" all involve a rapid oxidation and differ primarily in the rapidity of the process and the results (explosions are often highly destructive). For the materials of interest here, flammability is often determined by introducing the material as a gas or as a vapor from an evaporated liquid into a container with air or oxygen and determining whether deflagration occurs. Thus, throughout this document, I use the term "flammable" to indicate whether combustion can occur without regard for whether the combustion occurs in the vapor phase above the liquid/vapor interface of a liquid or as a deflagration or explosion in a gas/air mixture. Halocarbons The broad class of halocarbons consists of all molecules containing carbon and one or more of the following halogen atoms: fluorine, chlorine, bromine, and/or iodine. Halocarbons, as the term is used here, may also contain other chemical features such as hydrogen, oxygen, and/or nitrogen atoms; carbon-to-carbon multiple bonds; and aromatic rings.

Due to their generally low toxicities and low or non-existent flammability, one family of halocarbons—the chlorofluorocarbons (CFCs), which contain only carbon, chlorine, and fluorine atoms—has been used for many years in a variety of applications. Refrigerants Air conditioning, refrigerating, and heat pump appliances transfer heat from one area to another. In vapor compression systems, a chemical or mixture of chemicals, the refrigerant or "working fluid", is compressed in one area (the high-pressure side), where heat is given off, and then allowed to expand in a second area (the low-pressure side), where heat is taken up. In most cases, the working fluid condenses in the high pressure area and then evaporates in the low pressure area. A schematic of a typical refrigeration system is shown in FIG. 1.

CFCs have been the refrigerants of choice in many air conditioning, refrigerating, and heat pump appliances. Thus, CFC-12 (See *Halocarbon Nomenclature*, Center for Global Environmental Technologies, New Mexico Engineering Research Institute, The University of New Mexico, Albuquerque, N. Mex., Revised September 1997 for a discussion of this "halocarbon number" and other halocarbon nomenclature), also known as R-12 or dichlorodifluoromethane ($CCl_2F_2$), has been a widely used medium-pressure refrigerant for commercial and residential refrigeration, medium-pressure centrifugal chillers, and automobile air conditioners. CFC-11 (R-11, trichlorofluoromethane, $CCl_3F$) has been widely used in low-pressure centrifugal chillers, and CFC-114 (R-114, 1,2-dichloro-1,1,2,2-tetrafluoroethane, $CClF_2CClF_2$) is widely used by the U.S. Navy for centrifugal chillers. Other CFCs have also been used as refrigerants, either pure or in mixtures Foam Blowing Agents The manufacture of plastic foams for insulation, cushioning, and packaging foams requires the use of gas or volatile liquid blowing agents to create bubbles or cells. CFC-11, CFC-12, CFC-113 (1,1,2-trichloro-1,2,2-trifluoroethane, $CCl_2FCClF_2$), and CFC-114 have been used as blowing agents in the manufacture of foam plastic products. In addition to their remarkably low toxicities and lack of flammability, CFCs provide plastic closed-cell foams with excellent insulating ability and generally have good materials compatibility.

Solvents

CFC-113 has been widely used as a solvent in metals, electronic, and precision cleaning and/or decreasing. In this application, in addition to acceptable toxicities and low flammability, rapid evaporation is desired. Rapid evaporation decreases or eliminates energy consumption for drying cleaned parts. All CFCs in common use evaporate rapidly. CFCs and related materials have also been used for dissolution of solutes (dissolving) in many applications including aerosol sprays.

Aerosol Propellants and Sterilants

CFCs have also been used as aerosol propellants though this use is decreasing and is nearly absent in some areas of the world, and a mixture of CFC-12 and ethylene oxide ($C_2H_4O$) is used for gas sterilization of medical equipment and devices. Ethylene oxide is the actual sterilant; CFC-12 is added only to decrease the ethylene oxide flammability. It is estimated that in 1989, 95 percent of all U.S. hospitals used an ethylene oxide/CFC-12 mixture as a sterilant.

Global Environmental Problems

CFCs and many other halocarbons, have come to be recognized as serious global environmental threats due to their ability to cause stratospheric ozone depletion and global warming and their significant atmospheric lifetime. The ozone depletion and global warming impact of chemicals such as these is measured by the ozone depletion potential (ODP) and global warming potential (GWP). ODP and GWP give the relative ability of a chemical to deplete stratospheric ozone or to cause global warming on a per-pound-released basis. ODP and GWP are usually calculated relative to a reference compound (usually CFC-11 for ODP and either CFC-11 or carbon dioxide for GWP) and are usually calculated based on a release at the earth's surface. It is important to note that ODP and GWP values must be calculated by computer models; they cannot be measured. As models, theory, and input parameters change, the calculated values vary. For that reason, many different values of ODP and GWP are often found in the literature for the same compound. Nevertheless, the calculation results are very accurate in predicting which compounds are highly detrimental to ozone depletion or global warming, which are only moderately detrimental, and which have very low or essentially zero impacts.

Despite the wide utility of CFCs, their production has been severely restricted due to concerns about stratospheric ozone depletion. In fact, under the Montreal Protocol, an international treaty enacted in 1987 and amended in 1990, 1992, and 1995, the production of CFCs was phased out in all industrialized nations at the end of 1995. Moreover, the production of certain other halocarbon chemicals has also been halted. Thus, the production of methyl chloroform (1,1,1-trichloroethane, $CH_3CCl_3$), which like CFC-113 has been widely employed both as a solvent in cleaning applications and as a foam blowing agent, was also ended at the end of 1995 in industrialized countries.

Replacements and Proposed Replacements for Ozone Depleting Chemicals

Among the earliest chemicals proposed as replacements for CFCs and methyl chloroform were the hydrochlorofluorocarbons (HCFCs). These compounds contain hydrogen in addition to carbon, fluorine, and chlorine. The hydrogen atoms in the HCFCs react with hydroxyl free radicals, which are normal constituents of the earth's atmosphere, and this reaction decreases the atmospheric lifetime of HCFCs relative to CFCs. This decrease in atmospheric lifetime limits the amounts of HCFCs that reach the stratosphere to deplete ozone.

HCFC-22 (chlorodifluoromethane, $CHClF_2$) has long been the standard refrigerant for home air conditioners; however, HCFCs are now being promoted as CFC replacements in a number of other applications. For example, HCFC-123 (2,2-dichloro-1,1,1-trifluoroethane, $CHCl_2CF_3$) is now widely used as a replacement for CFC-11 in low-pressure centrifugal chillers and, along with HCFC-141b (1,1-dichloro-1-fluoroethane, $CH_3CCl_2F$) and HCFC-124 (2-chloro-1,1,1,2-tetrafluoroethane, $CHClFCF_3$), as a foam blowing agent. HCFCs such as a mixture of the two isomers HCFC-225 ca (3,3-dichloro-1,1,1,2,2-pentafluoropropane, $CHCl_2CF_2CF_3$) and HCFC-225 cb (1,3-dichloro-1,1,2,2,3-pentafluoropropane, $CHClFCF_2CClF_2$) are also being used for cleaning. Unfortunately, the atmospheric destruction process for HCFCs is insufficiently efficient to prevent all of a chemical from reaching the stratosphere. Thus, HCFCs exhibit a low, but significant, ODP. For that reason, HCFCs are scheduled for eventual phaseout under the amended Montreal Protocol.

Much research has gone on to find replacements for the CFCs, HCFCs, and methyl chloroform. Hydrofluorocarbons (HFCs), which contain only hydrogen, fluorine, and carbon, and perfluorocarbons (PFCs or FCs), which contain only fluorine and carbon, are being commercialized as replacement chemicals in a number of applications. Since these materials contain no chlorine, bromine, or iodine (required, in most cases, if a compound is to exhibit significant stratospheric ozone depletion), they have a nominally zero ODP. (Here, I use the word "nominally" since calculations have shown an exceedingly small ODP for some of these materials.) However, HFCs and PFCs have very long atmospheric lifetimes and contribute to global warming. In fact, many PFCs have atmospheric lifetimes of several thousand years, compared with a few years for most HCFCs and a few hundred years for most CFCs. Moreover, a number of HFCs and HCFCs are flammable. When present as gases in volume containing oxygen (for instance, when the refrigerant leaks into a room), explosions can occur. Many new refrigerants—1,1-difluoroethane (HFC-152a, $CH_3CHF_2$), difluoromethane (HFC-32, $CH_2F_2$),1,1,1-trifluoroethane (HFC-143a, $CH_3CF_3$),1,1-dichloro-1-fluoroethane (HCFC-141b, $CH_3CCl_2F$), and 1-chloro-1,1-difluoroethane (HCFC-142b, $CH_3CClF_2$)—are flammable and/or explosive, at least under some conditions. (It should be noted, that HCFC-141b and HCFC-142b are less flammable than the other alternatives listed and, in fact, are stated to be nonflammable in some sources. Both of these compounds do, however, have upper and lower flammability limits and HCFC-142b is classified as flammable in refrigeration standards issued by the American Society of Heating, Refrigerating and Air-Conditioning Engineers, which gives no classification for HCFC-141b). This list of flammable HFC and HCFC refrigerants includes some of the most energy-efficient refrigerants, particularly HFC-152a and HFC-32. Flammable refrigerants are often mixed with nonflammable refrigerants to produce lower flammability or nonflammable refrigerant blends for commercialization, and a large number of such blends are now being marketed. In this document, I use the term "dilution" to indicate all non-chemical (i.e., "physical") means by which a nonflammable component reduces flammability (e.g., dilution of oxygen and heat absorption). Reduction of flammability primarily by dilution is less than satisfactory, however, since a large amount of nonflammable refrigerant must often be added to a flammable refrigerant to obtain a nonflammable blend, and this often produces less than optimal properties.

Many non-halocarbons are being commercialized or seriously considered as CFC replacements. The use of hydrocarbon refrigerants such as propane ($CH_3CH_2CH_3$, R-290), isobutane [$CH_3CH(CH_3)CH_3$, R600a], and propylene ($CH_2$=$CHCH_3$, R-1270) is increasing in many parts of the world. These materials are highly energy-efficient and have excellent global environmental properties (low atmospheric lifetimes, low GWPs, and zero ODPs); however, they are also highly flammable, and this has limited their use in many countries and in many applications. In some cases, these hydrocarbons are being blended with nonflammable refrigerants (as is being done for flammable HFCs and HCFCs); however, this often reduces the energy efficiency and increases the global environmental impact. Ammonia ($NH_3$), a highly energy-efficient refrigerant that has been used for many years, has a zero ODP and a very low atmospheric lifetime and GWP; however, its flammability is coming under increasing scrutiny. Blends of ammonia with HFCs are now being considered to decrease the flammability problem.

The hydrocarbon cyclopentane ($C_5H_{10}$) is now used to blow refrigerator insulating foams in some parts of the world, and hydrocarbons such as n-pentane ($CH_3CH_2CH_2CH_2CH_3$), isopentane [$(CH_3)_2CHCH_2CH_3$], n-butane ($CH_3CH_2CH_2CH_3$), and isobutane have long been used in the production of extruded polystyrene foam sheet products. However, these hydrocarbons are flammable. Other flammable chemicals being considered or being used as blowing agents are HCFC-141b, HFC-152a, 2-chloropropane ($CH_3CHClCH_3$), and acetone [$CH_3C(O)CH_3$]. Conversion from CFC and methyl chloroform to flammable blowing agents will entail significant capital investment to ensure worker safety. There is also concern about the ability of foams blown with flammable blowing agents to meet code requirements and safety standards.

No solvent that is equivalent to CFC-113 and methyl chloroform in toxicity and safety; has a low ODP, GWP, and atmospheric lifetime; and is an effective and easily evaporated cleaner has been identified (Tapscott, R. E., and Skaggs, S. R., *Identification of Alternatives to CFC-113 for Solvent Cleaning*, NASA White Sands Test Facility, Las Cruces, N. Mex., September 1994). A number of new chemicals—e.g., monochlorotoluenes, benzotrifluorides, volatile methyl siloxanes (VMSs), and terpenes—that are being considered or that are now used as solvents have very good global environmental and solvent properties but are flammable, and this flammability limits their use. There will also be increasing use of flammable chemicals long used as solvents-alcohols, petroleum distillates and other hydrocarbons, ethers, esters, and ketones.

A number of flammable materials are being used or considered for use as aerosol propellants. Among these are the hydrocarbons n-butane ($CH_3CH_2CH_2CH_3$), isobutane [$(CH_3)_2CHCH_3$], and propane ($CH_3CH_2CH_3$); dimethyl ether ($CH_3OCH_3$); siloxanes; HFC-152a; HCFC-141b; and HCFC-142b.

Flammable materials have been used in the past as refrigerants, foam blowing agents, cleaning solvents, and aerosol propellants; however, the number of applications and usage are increasing due to the production bans on CFCs. Moreover, as regulations on HFCs and HCFCs increase, there will be increasing pressure to use hydrocarbons, petroleum distillates, ethers, and other highly flammable materials.

Solution to Flammability Problems

The applicability of many of the most useful substitutes or potential substitutes for CFCs in refrigeration, foam blowing, cleaning, aerosol propulsion, and chemical sterilization is severely limited by concerns about flammability. As noted earlier, in some cases, blending of nonflammable materials whose mode of action is primarily dilution with flammable materials has allowed the production of nonflammable or low-flammability products; however, this course of action has been less than satisfactory due to the large amount of nonflammable components needed in many cases. What I claim here is the use of highly effective additives to decrease or eliminate flammability of normally flammable refrigerants, foam blowing agents, cleaning solvents, aerosol propellants, and sterilants. The action of these additives is not due solely to dilution, as in existing and proposed blends with nonflammable components; these additives also act chemically to actually suppress flammability. Such additives can be used in relatively low amounts and, therefore, have a decreased influence on the characteristics of the principal component or components. The mode of action is described immediately below.

Bromine- and iodine-containing compounds disrupt the free-radical chain reactions that maintain combustion. This disruption is a highly effective "chemical" mechanism for fire suppression, as opposed to the primarily "physical" (i.e., "dilution") mechanisms of cooling and smothering provided by nonflammable components used to obtain many nonflammable refrigerant and other blends. Iodides, though useful in direct fire protection technologies, appear to have too high a toxicity and too low a stability for serious consideration as additives in the specific applications discussed here. Bromine-containing compounds, such as the halon fire extinguishing agents, are also highly effective chemical fire suppressants. However, bromine-containing compounds in the specific chemical forms used today as fire extinguishing agents (bromochlorofluoro- and bromofluoroalkanes) have high ODPs because of their long atmospheric lifetimes, and their production has been banned in industrialized nations. Moreover, production of the one (briefly) commercialized bromine-containing halon replacement $CHBrF_2$ (HBFC-22B1) has now also been banned in industrialized nations under the Montreal Protocol along with all other hydrobromofluorocarbons (HBFCs). In this case, the presence of a hydrogen atom in the molecule (without other features described in the present disclosure) was insufficient to achieve the hoped-for low atmospheric lifetime. In fact, none of the many halon substitute technologies now being commercialized contain bromine due to the concern about their expected high ODP. It should be noted that once they enter the stratosphere, bromine-containing compounds are about 40 times more destructive to stratospheric ozone than are chlorine-containing compounds (Solomon, S., and Albritton, D. L., "Time-Dependent Ozone Depletion Potentials for Short- and Long-Term Forecasts," *Nature*, Vol. 357, pp. 33—37, 7 May 1992).

There is, however, a solution to the problem of stratospheric ozone depletion by bromine-containing compounds. If chemical features that promote extremely rapid atmospheric removal are incorporated into the compounds, insufficient amounts of the materials will reach the stratosphere to cause significant stratospheric ozone depletion. Thus, the compounds will have exceptionally low ODPs, even though they contain bromine, which is normally a strong ozone depleter. In fact, the resulting short atmospheric lifetimes will also result in low GWPs. Using this concept, I have (1) examined mechanisms for removal of compounds from the atmosphere, (2) determined chemical features that could enhance the various removal processes, and (3) carried out calculations to estimate the atmospheric lifetimes. This three-step process has allowed us to invent several families of bromine-containing halocarbons that have very short atmospheric lifetimes. Moreover, my calculations and estimation methods indicated that these compounds had much shorter atmospheric lifetimes than I had expected and that these very short atmospheric lifetimes resulted in very low estimated ODPs. I then discovered that such compounds can be used as additives to normally flammable materials proposed or used in the following five applications covered by this disclosure:

1. Refrigeration
2. Foam Blowing
3. Cleaning, Degreasing, and Solute Dissolution
4. Aerosol Propulsion
5. Sterilization Thus, pursuant to the present invention, the following seven groups of compounds having short tropospheric lifetimes and correspondingly low ODPs and GWPs, but also having chemical features (specifically, bromine) that promote effectiveness to reduce flammability have been arrived at. These families are the 1. Bromine-Containing Alkenes
2. Bromine-Containing Alcohols
3. Bromine-Containing Ethers 4. Bromine-Containing Amines
5. Bromine-Containing Carbonyl Compounds
6. Bromine-Containing Aromatics
7. Bromine-Containing Non-Fluorinated Alkanes Accordingly, it is the object of the present invention to provide bromine-containing additives that act chemically to reduce the flammability of refrigerants, foam blowing agents, cleaning agents, aerosol propellants, and chemical sterilants and that are rapidly destroyed or removed by natural processes in the troposphere. I refer to such additives as "tropodegradable." As a result of the rapid degradation in the troposphere or removal from the troposphere, the additives will have very short atmospheric lifetimes, low ozone depletion potentials, and low global warming potentials. My criterion is that the estimated atmospheric lifetime be on the order of days or weeks, giving ODPs and GWPs that approach zero (probably less than 0.02 ODP) for a ground-level release. Note that I do not consider materials such as HCFCs, HFCs, and HBFCs to be "tropodegradable" as defined here, even though such chemicals are partially destroyed in the troposphere. The destruction processes are relatively inefficient compared to those for the additives claimed here, and HCFCs, HFCs, and HBFCs normally have atmospheric lifetimes of years to hundreds of years.

SUMMARY OF THE INVENTION

Figure 1:
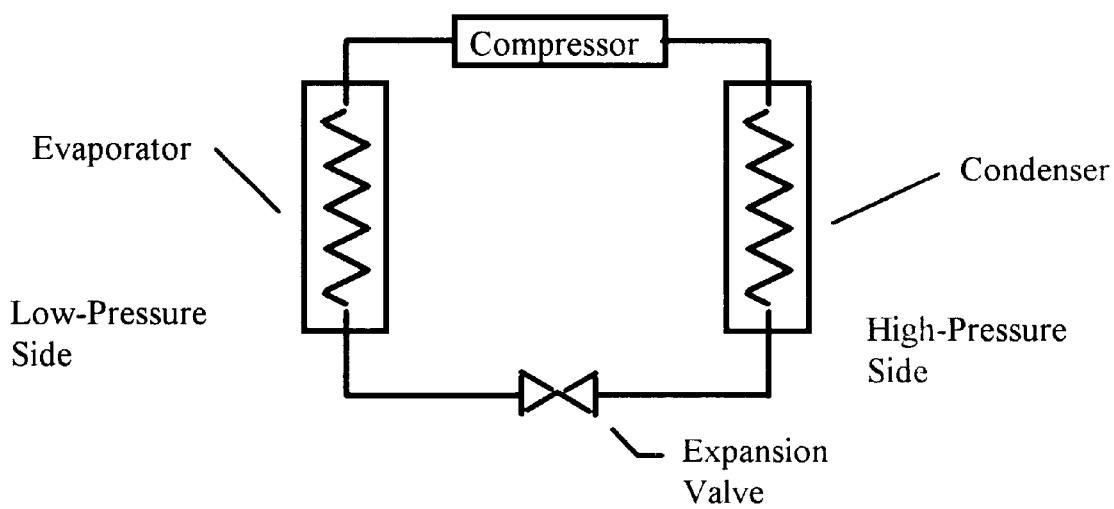
FIG. 1: A schematic of a typical refrigeration system.

The present invention provides tropodegradable bromine-containing halocarbons that can be used as additives to reduce or eliminate the flammability of normally flammable refrigerants, foam blowing agents, solvents, aerosol propellants, and sterilants and/or that can be used to provide nonflammable or low-flammability refrigerant, foam blowing agent, solvent, aerosol propellant, and sterilant and sterilant mixtures. These compounds in accordance with the invention have the characteristics of high effectiveness for flammability reduction, but have short atmospheric lifetimes (on the order of days or weeks) resulting in low ODPs and GWPs. These chemicals are of seven classes: (1) bromine-containing alkenes, (2) bromine-containing alcohols, (3) bromine-containing ethers, (4) bromine-containing amines, (5) bromine-containing carbonyl compounds, (6) bromine-containing aromatics, and (7) bromine-containing non-fluorinated alkanes. In general, to reduce hepatotoxicity and flammability, such compounds, with the exception of the bromine-containing alkanes, will be at least partially fluorinated. The compounds may also contain chlorine, but should contain no iodine. To obtain the desired low atmospheric lifetimes, the amines and ethers preferably contain at least one hydrogen atom attached to a carbon atom adjacent to nitrogen or oxygen. The prediction of atmospheric lifetimes for these additives is described below.

Four primary processes exist for removal of organic molecules from the troposphere: (1) reaction with tropospheric hydroxyl free radicals; (2) photolysis; (3) physical removal; and (4) reaction with tropospheric ozone.

Hydroxyl free radicals (.OH) are found naturally in the earth's troposphere. These free radicals react with atmospheric pollutants or other atmospheric compounds that contain hydrogen atoms within their molecules or that are unsaturated. Unsaturated compounds include compounds containing carbon-carbon double bonds (e.g., C=C) and aromatic compounds such as benzene. HCFCs, HFCs, and HBFCs have hydrogen atoms within their molecules and, therefore, react with tropospheric hydroxyl free radicals. However, this reaction is relatively inefficient for the HCFCs and HFCs, many of which are in use today, and for the HBFCs, whose production has now been banned, giving them relatively long atmospheric lifetimes. I have realized, however, that hydrogen atoms on carbon atoms that are adjacent to oxygen or nitrogen atoms are more susceptible to reaction with tropospheric hydroxyl free radicals than they would otherwise be. Thus amines [compounds containing a nitrogen atom, N, attached to three groups to give the characteristic structure N(R)(R')(R"), where the R, R', and R" groups are organic substituents or hydrogen atoms] and ethers (compounds containing an oxygen atom, O, attached to two organic groups R and R'to give the characteristic structure R—O—R') react relatively quickly with tropospheric hydroxyl free radicals as long as the molecules contain one or more hydrogen atoms attached to carbon atoms adjacent to the nitrogen or oxygen atoms. My recent work indicates that this may be true even when the hydrogen atoms occupy other positions in amine and ether molecules. I have calculated estimated lifetimes of less than one year for many hydrofluoroamines (HFAs) and hydrofluoroethers (HFEs). Moreover, I estimate that the replacement of a fluorine atom with a bromine atom in these materials will decrease the lifetime by approximately a factor of ten due, at least in part, to enhanced photolysis (see below). Using this reasoning, I have estimated atmospheric lifetimes as short as 11 days for some hydrobromofluoroamines (HBAs) and hydrobromofluoroethers (HBFEs). Using a limited amount of data, I estimate that for bromine-containing compounds, each 10 years increase in atmospheric lifetime increases the ODP by approximately 2. Thus, I estimate a minimum ODP of around 0.006 for some HBFAs and HBFEs. I also note that nonfluorinated amines and ethers, though of slightly less interest, would have even shorter atmospheric lifetimes and lower ODPs. Estimations using the same type of calculations show that alcohols [compounds containing the structural feature HOC(R)(R') (R"), where the R, R', and R"groups are organic substituents or hydrogen atoms] also react rapidly with hydroxyl free radicals when they contain a hydrogen atom on a carbon atom adjacent to the OH group characteristic of alcohols. However, a more important atmospheric removal process (rainout, see below) exists for many alcohols.

I have also calculated that many non-fluorine-containing bromoalkanes will have very short atmospheric lifetimes due to reaction with tropospheric hydroxyl free radicals. For example, using published rate constants for reaction of hydroxyl free radicals with related compounds and reasoning similar to that described above, I estimate an atmospheric lifetime of approximately four weeks and an ODP of 0.017 for 1-bromopropane ($CH_2BrCH_2CH_3$). Of some interest is that these values should decrease as the carbon chain length increases. Thus, the ODP and atmospheric lifetime of, for example, 1-bromobutane ($CH_2BrCH_2CH_2CH_3$), should be even shorter.

Unsaturated compounds such as alkenes [compounds containing the structural feature (R)(R')C=C(R")(R'"), where the R, R', R", and R'" groups are organic substituents, chlorine, bromine, fluorine, or hydrogen atoms] and aromatics (compounds containing a benzene, $C_6$, ring or related structural features) react very rapidly with tropospheric hydroxyl free radicals. I estimate lifetimes on the order of a few days for these types of compounds with correspondingly low ODPs for bromine-containing derivatives.

Some compounds are broken down by sunlight in a process known as photolysis, and my estimations show that this is likely to be an effective tropospheric removal process for carbonyl compounds [compounds containing a group (R)(R')C=O, where R and R'are any substituents). Such carbonyl compounds include aldehydes [(R)(H)C=O, where R is an alkyl or aryl group], ketones [(R)(R')C=O, where R and R'are alkyl or aryl groups], and esters [(RO)(R')C=O, where R and R' are alkyl or aryl groups]. Carbonyl compounds are also subject to removal by rainout, as described below.

Rainout is an important physical removal process in the troposphere. Rain can remove water-soluble materials from the atmosphere. This is a highly effective process for very polar materials, and is likely to be a very important removal process for alcohols. It may also be an effective removal process for some carbonyl compounds.

Finally, ozone ($O_3$) appears both in the troposphere (where it is an undesirable pollutant) and in the stratosphere (where it is desirable and protects the earth from ultraviolet radiation from the sun). Tropospheric ozone reacts rapidly with alkenes and provides a highly effective removal process for these compounds, making their atmospheric lifetimes even shorter than would be predicted only from consideration of their reaction with hydroxyl free radicals.

Thus, alkenes react rapidly with hydroxyl free radicals and ozone in the troposphere and therefore degrade before significant quantities can reach the stratosphere, where any bromine present can react with stratospheric ozone. The presence of the hydroxyl group in alcohols enhances reactions of hydrogen atoms present in the molecule with tropospheric hydroxyl free radicals. Alcohols are also expected to be removed rapidly from the atmosphere by rainout. Ethers and amines react rapidly with tropospheric hydroxyl free radicals, at least when there are one or more hydrogen atoms immediately adjacent to the oxygen or nitrogen atoms. Nonfluorinated bromoalkanes, with more than two carbon atoms, and aromatic compounds also react rapidly with hydroxyl free radicals. Carbonyl compounds are photolyzed by sunlight in the troposphere and, moreover, are subject to rainout. It should be noted, that the present invention, includes chemical compounds that contain combinations of chemical features promoting atmospheric removal. For example, I define carbonyl compounds as any compound containing a carbonyl group even though other atmospheric removal promoting groups (e.g., C=C, hydroxyl groups, etc.) may be present.

The compounds of the present invention include the following compounds, none of which contain iodine:

1. Bromine-containing alkenes having one or more double bonds such as 1-bromo-1,1-difluoro-2-propene ($CH_2$=$CHCF_2Br$); 2-bromo-1,1,-trifluoro-2-propene ($CH_2$=$CBrCF_3$); 1-bromo-3,3,3-trifluoro-1-propene ($BrCH$=$CHCF_3$);3-bromo-1,1,3,3-tetrafluoro-1-propene ($CF_2$=$CHCF_2Br$); 2,3-dibromo-3,3-difluoro-1-propene ($CH_2$=$CBrCBrF_2$); 1,2-dibromo-3,3,3-trifluoro-1-propene ($BrCH$=$CBrCF_3$); 4-bromo-3,3,4,4-tetrafluoro-1-butene ($CH_2$=$CHCF_2CF2Br$); 4-bromo-3-chloro-3,4,4-trifluoro-1-butene ($CH_2$=$CHCClCF_2Br$); 4-bromo-3,4,4-trifluoro-3-trifluoromethyl-1-butene [$CH_2$=$CHCF(CF_3)CBrF_2$]; and 2-bromo-1,1,1-trifluoro-2-propene ($CF_3CHBr$=$CH_2$).

2. Bromine-containing alcohols having one or more hydroxyl groups such as 1-bromo-1,1-difluoro-2-ethanol ($CF_2BrCH_2OH$) and 1-bromo-1,2-difluoro-1,2-ethanediol ($CHFOHCFBrOH$).

3. Bromine-containing ethers with at least one hydrogen atom (preferably attached to a carbon atom adjacent to the oxygen atom) such as (difluoromethyl)(bromofluoromethyl)ether ($CF_2H$—O—$CFHBr$) and (2,2,2-trifluoroethyl)(2-bromo-2,2-difluoroethyl)ether ($CF_3CH_2$—O—$CH_2CF_2Br$).

4. Bromine-containing amines with at least one hydrogen atom (preferably attached to a carbon atom adjacent to the nitrogen atom) such as (bromodifluoromethyl)bis(difluoromethyl)amine [$(CBrF2)(CHF_2)_2N$] and (bromodifluoromethyl)(trifluoromethyl)methylamine [$(CBrF_2)(CF_3)(CH3)N$]

5. Bromine-containing carbonyl compounds, including bromine-containing esters, bromine-containing ketones, and bromine-containing aldehydes, such as methyl 2-bromo-2,2-difluoroacetate ($CF_2BrCH_2COOCH_3$), 1-bromo-1,1-difluoro-3-butanone [$CF_2BrCH_2C(O)CH_3$], and 1-bromo-1,1-difluoro-3-propanaldehyde [$CF_2BrCH2C(O)H$].

6. Bromine-containing aromatics such as bromopentafluorobenzene ($C_6F_5Br$), (bromodifluoromethyl)pentafluorobenzene ($C_6F_5CBrF_2$), and the 2-bromo, 3-bromo, and 4-bromo isomers of bromoheptafluorotoluene ($C_6BrF_4CF_3$).

7. Bromine-containing alkanes containing no fluorine atoms such as bromoethane ($CH_3CH_2Br$), 1-bromopropane ($CH_2BrCH_2CH_3$), 2-bromopropane ($CH_3CHBrCH_3$), 1-bromobutane ($CH_2BrCH_2CH_2CH_3$), 2-bromobutane ($CH_3CHBrCH_2CH_3$), 1-bromo-2-methylpropane [$CH_2BrCH(CH_3)CH_3$], and 1-bromo-2-chloroethane ($CH_2BrCH_2Cl$). It is important that hydrogen atoms be present in these compounds.

It is not necessary that the additive be nonflammable, though that may usually be the case. In some instances, the additive may be flammable and still reduce the flammability of the material with which it is mixed. For example, I have found that the flammable compound bromotrifluoroethene ($CF_2$=$CFBr$) provides flammability reduction for ethylene oxide mixtures.

The specific additive needed will depend on both the application and the material whose flammability is to be reduced. Based on past studies, application needs, and molecular structure requirements, I anticipate that the most useful alkenes, alcohols, ethers, and nonfluorinated akanes will be those containing six or fewer carbon atoms; the most useful amines and aromatics will be those containing twelve or fewer carbon atoms; and the most useful carbonyl compounds will be those containing two to eight carbon atoms. In some cases, and, in particular, in flammability reducing additives for solvents, additives with more carbon atoms may prove useful.

The amount of additive needed will depend on the application, the material whose flammability is to be reduced, and the specific additive. Based on past studies and application needs, I anticipate that additives will be most useful at concentrations ranging from 1–80% by weight, although the concentration of additives in the mixtures can range from 0.1–99% by weight. Expedient proportions include 5–40% by weight of additive for refrigerant mixtures, 5–50% by weight of additive for foam blowing agent mixtures, 1–99% additive for solvent mixtures, 5–25% by weight additive for aerosol propellant mixtures, and 5–40% by weight additive for sterilant mixtures.

As noted earlier, refrigerants, foam blowing agents, solvents, aerosol propellants, and/or sterilants may be either gases (vapors) or liquids. In many cases, materials are stored in one form and used in another. For example, foam blowing agents may be stored as a liquid and used as a gas when the foam is actually blown. In some cases, both gaseous and liquid forms are present during use. Thus, refrigerants are present in both vapor and liquid forms during the operation of most refrigerators or heat pumps. In the gas phase, normally flammable refrigerants, foam blowing agents, solvents, aerosol propellants, and/or sterilants containing the flammability reducing additive will have a reduced flanunability due to the presence of the additive. Of particular importance is the action of the additive when the refrigerant, foam blowing agent, solvent, aerosol propellant, and/or sterilant is in the liquid state. The flammability reducing additives claimed here are volatile, though some are more-so and some less-so. Thus, normally flammable liquid refrigerants, foam blowing agents, solvents, aerosol propellants, and sterilants containing these additives will, upon full or partial evaporation, produce vapors that have lower flammabilities due to the presence of the flammability reducing additives, which also evaporate. Of particular importance is that release of the additives when refrigerants, foam blowing agents, solvents, aerosol propellants, and refrigerants evaporate or are otherwise released into an area will aid in reducing flammability of the vapor above the liquid/vapor interface (i.e., combustible liquids) and explosivity of the vapor if released into a volume such as a room.

These and other aspects of the present invention will be more apparent upon consideration of the following detailed description of the invention.

DESCRIPTION OF PREFERRED EMBODIMENTS

Whereas many compounds desirable as refrigerants, foam blowing agents, cleaning solvents, aerosol propellants, and the sterilant ethylene oxide are known to be flammable, one or more of the compounds of the present invention can be added to such materials to provide products with reduced flammabilities. Moreover, these additives have low estimated atmospheric lifetimes (on the order of days or weeks) while containing chemical features that give a good efficiency for reduction of flammability. The short atmospheric lifetimes for the additives lead to low (near zero) stratospheric ozone depletion potentials and low (near zero) global warming potentials. Families of compounds with these characteristics are (1) bromine-containing alkenes, (2) bromine-containing alcohols, (3) bromine-containing ethers with at least one hydrogen atom (preferably attached to a carbon atom adjacent to the oxygen atom), (4) bromine-containing amines with at least one hydrogen atom (preferably attached to a carbon atom adjacent to the nitrogen atom), (5) bromine-containing carbonyl compounds, (6) bromine-containing aromatics, and (7) bromine-containing non-fluorinated alkanes.

EXAMPLE 1

Into an enclosed 7930 cubic-centimeter chamber was introduced a stoichiometric, explosive and flammable mixture of propane fuel and air. A spark discharge of 70 Joules stored capacitive energy ignited the mixture. In a separate experiment, a quantity of 4-bromo-3,3,4,4-tetrafluoro-1-butene ($CH_2=CHCF_2CF_2Br$) sufficient to give a concentration of 5.3 percent by gas volume was added to a stoichiometric mixture of propane fuel and air in the enclosed 7930 cubic-centimeter chamber. A spark discharge of 70 Joules stored capacitive energy failed to ignite the mixture. This illustrates the use of a tropodegradable bromine-containing halocarbon additive to prevent the flammability of propane gas, which can be used in refrigerants or foam blowing agents.

EXAMPLE 2

To approximately 10 milliliters (mL) of the normally highly flammable solvent acetone ($CH_3C(O)CH_3$) is added 2-bromo-3,3,3-trifluoropropene ($CH_2=CBrCF_3$) to produce a mixture containing approximately 20% by weight 2-bromo-3,3,3-trifluoropropene. The mixture is ignited with a small torch, but does not sustain a flame. Without the addition of the 2-bromo-3,3,3-trifluoropropene, acetone ignites and burns until completely consumed. This illustrates the use of a tropodegradable compound to decrease the flammability of a normally flammable solvent.

EXAMPLE 3

A mixture of the flammable sterilant ethylene oxide ($C_2H_4O$) with pentafluoroethane ($CF_3CHF_2$) was introduced into an enclosed 7930 cubic-centimeter chamber containing air to give a final concentration of 2.9% ethylene oxide ($C_2H_4O$) and 9.0% pentafluoroethane ($CF_3CHF_2$) by volume (the remainder being air). A spark discharge of 70 Joules stored capacitive energy caused the mixture to ignite. In a second study, a mixture of 3.3% ethylene oxide ($C_2H_4O$), 8.235% pentafluoroethane ($CF_3CHF_2$), and 0.765% bromotrifluoroethene ($CF_2=CFBr$) by volume (the remainder being air) failed to ignite with a spark discharge of 70 Joules stored capacitive energy in the enclosed 7930 cubic-centimeter chamber. Thus, the addition of a relatively small amount of the tropodegradable bromocarbon bromotrifluoroethene ($CF_2=CFBr$) provided nonflammability even when a larger amount of the flammable sterilant ethylene oxide ($C_2H_4O$) was present. This illustrates the use of a tropodegradable compound to prevent the flammability of a sterilant. This also illustrates the benefit of a chemically active flammability reducing additive (bromotrifluoroethene) in comparison with an additive that works by dilution only (pentafluoroethane).

The present invention has been described and illustrated with reference to certain preferred embodiments. Nevertheless, it will be understood that various modifications, alterations and substitutions may be apparent to one of ordinary skill in the art, and that such modifications, alterations and substitutions may be made without departing from the essential invention. Accordingly, the present invention is defined only by the following claims.

I claim:

1. A method of reducing or eliminating the flammability of solvent used in metal, electronic, and precision cleaning and/or degreasing, and/or used in metals, electronic, and precision cleaning and/or degreasing, and/or used for dissolution of a solute, said method comprising the steps of:

a) providing an additive comprising at least one compound selected from the group consisting of bromine-containing alkenes, bromine-containing alcohols, bromine-containing ethers with at least one hydrogen atom, bromine-containing carbonyl compounds, and bromine-containing aromatics, and b) mixing said additive with said solvent, wherein said solvent comprises at one component selected from the group of hydrocarbons, halocarbons, hydrochlorofluorocarbons (HCFs), hydrofluorocarbons (HFCs), terpenes, siloxanes, alcohols, ketones, esters, ethers, hydrofluoroethers (HFCs), monochlorotoluenes, benzotrifluoride, and hydrofluoropolyethers (HFPEs) to form a mixture containing between 0.1 and 99 percent by weight of said additive.

2. The method of claim 1, wherein said solvent comprises at least one component selected from the group of 1,1- dichloro-1-fluoroethane (HCFC-141b, $CH_3CCl_2F$), 1,1,1,2,
2,4-hexafluorobutane (HFC-356mcf, $CF_3CF_2CH_2CH_2F$),
anisole (methyl phenyl ether, $C_6H_5OCH_3$), dipropylene glycol monomethyl ether
($CH_3OCH_2CH_2CH_2OCH_2CH_2CH_2OH$), ethyl lactate
($CH_3CHOHCOOCH_2CH_3$), ethanol ($CH_3CH_2OH$),
n-propanol ($CH_3CH_2CH_2OH$), isopropanol [$(CH_3)_2CH_2OH$], n-butanol ($CH_3CH_2CH_2CH_2OH$), 2-pentanol
($CH_3CHOHCH_2CH_3$), tetrahydrofurfuryl alcohol ($C_4H_7OCH_2OH$), acetone [$CH_3C(O)CH_3$], N-methyl-2-pyrrolidone ($CH_3NCH_2CH_2CH_2CO$), methyl ethyl ketone
[$CH_3C(O)CH_2CH_3$], trichloroethylene ($CHCl=CCl_2$), hexamethyldisiloxane [$(CH_3)_3SiOSi(CH_3)_3$], octamethyltrisiloxane [$(CH_3)_3SiOSi(CH_3)_2OSi(CH_3)_3$], decamethyltetrasiloxane [$(CH_3)_3SiOSi(CH_3)_2OSi(CH_3)_2OSi(CH_3)_3$],
dodecamethylcyclohexasiloxane ($[(CH_3)_2SiO]_6$), benzotrifluoride ($C_6H_5CF_3$), monochlorotoluenes ($C_6H_4ClCH_3$), and
C6 to C20 petroleum distillates and other hydrocarbons.

3. The method of claim 1 wherein said additive comprises at least one bromine-containing alkene containing one or more bromine atoms and two to six carbon atoms, the remaining atoms being selected from the group consisting of hydrogen, chlorine, and fluorine atoms.

4. The method of claim 1 wherein said additive comprises at least one bromine-containing alcohol containing one or more bromine atoms and one to six carbon atoms, the remaining atoms being selected from the group consisting of hydrogen, chlorine, and fluorine atoms.

5. The method of claim 1 wherein said additive comprises at least one bromine-containing ether with at least one hydrogen atom and containing one or more bromine atoms and two to six carbon atoms, the remaining atoms being selected from the group consisting of hydrogen, chlorine, and fluorine atoms.

6. The method of claim 1 wherein said additive comprises at least one bromine-containing amine with at least one hydrogen atom and containing one or more bromine atoms and three to twelve carbon atoms, the remaining atoms being selected from the group consisting of hydrogen, chlorine, and fluorine atoms.

7. The method of claim 1 wherein said additive comprises at least one bromine-containing carbonyl compound, said compound being selected from the group consisting of esters, ketones, or aldehydes and containing one or more bromine atoms and two to eight carbon atoms, the remaining atoms being selected from the group consisting of hydrogen, chlorine, and fluorine atoms.

8. The method of claim 1 wherein said additive comprises at least one bromine-containing aromatic compound and containing one or more bromine atoms and six to twelve carbon atoms, the remaining atoms being selected from the group consisting of hydrogen, chlorine, and fluorine atoms.

9. A solvent mixture used for cleaning, degreasing, and/or for dissolution of a solute comprising:

a) a solvent, wherein said solvent comprises at least one component selected from the group of hydrocarbons, halocarbons, hydrochlorofluorocarbons (HCFCs), hydrofluorocarbons (HFCs), terpenes, siloxanes, alcohols, ketones, esters, ethers, hydrofluoroethers (HFEs), monochlorotoluenes, benzotrifluoride, and hydrofluoropolyethers (HFPEs), and b) between 0.1 and 99 percent by weight of an additive for reducing or eliminating the flammability of said solvent mixture, and additive comprising at least one compound selected from the group consisting of bromine-containing alkenes, bromine-containing alcohols, bromine-containing ethers with at least one hydrogen atom, bromine-containing amines with at least one hydrogen atom, bromine-containing carbonyl compounds, and bromine-containing aromatics.

10. The mixture of claim 9, wherein said solvent comprises at least one component selected from the group of 1,1-dichloro-1- fluoroethane (HCFC-141b, $CH_3CCl_2F$), 1,1,1,2,2,4-hexafluorobutane (HFC-356mcf, $CF_3CF_2CH_2CH_2F$), anisole (methyl phenyl ether, $C_6H_5OCH_3$), dipropylene glycol monomethyl ether ($CH_3OCH_2CH_2CH_2OCH_2CH_2CH_2OH$), ethyl lactate ($CH_3CHOHCOOCH_2CH_3$), ethanol ($CH_3CH_2OH$), n-propanol ($CH_3CH_2CH_2OH$), isopropanol [$(CH_3)_2CH_2OH$], n-butanol ($CH_3CH_2CH_2CH_2OH$), 2-pentanol ($CH_3CHOHCH_2CH_3$), tetrahydrofurfuryl alcohol ($C_4H_7OCH_2OH$), acetone [$CH_3C(O)CH_3$], N-methyl-2-pyrrolidone ($CH_3NCH_2CH_2CH_2CO$), methyl ethyl ketone [$CH_3C(O)CH_2CH_3$], trichloroethylene ($CHCl=CCl_2$), hexamethyldisiloxane [$(CH_3)_3SiOSi(CH_3)_3$], octamethyltrisiloxane [$(CH_3)_3SiOSi(CH_3)_2OSi(CH_3)_3$], decamethyltetrasiloxane [$(CH_3)_3SiOSi(CH_3)_2OSi(CH_3)_2OSi(CH_3)_3$], dodecamethylcyclohexasiloxane ($[(CH_3)_2SiO]_6$), benzotrifluoride ($C_6H_5CF_3$), monochlorotoluenes ($C_6H_4ClCH_3$), and C6 to C20 petroleum distillates.

11. The mixture of claim 9 wherein said additive comprises at least one bromine-containing alkene containing one or more bromine atoms and two to six carbon atoms, the remaining atoms being selected from the group consisting of hydrogen, chlorine, and fluorine atoms.

12. The mixture of claim 9 wherein said additive comprises at least one bromine-containing alcohol containing one or more bromine atoms and one to six carbon atoms, the remaining atoms being selected from the group consisting of hydrogen, chlorine, and fluorine atoms.

13. The mixture of claim 9 wherein said additive comprises at least one bromine-containing ether with at least one hydrogen atom and containing one or more bromine atoms and two to six carbon atoms, the remaining atoms being selected from the group consisting of hydrogen, chlorine, and fluorine atoms.

14. The mixture of claim 9 wherein said additive comprises at least one bromine-containing amine with at least one hydrogen atom and containing one or more bromine atoms and three to twelve carbon atoms, the remaining atoms being selected from the group consisting of hydrogen, chlorine, and fluorine atoms.

15. The mixture of claim 9 wherein said additive comprises at least one bromine-containing carbonyl compound, said compound being selected from the group consisting of esters, ketones, or aldehydes and containing one or more bromine atoms and two to eight carbon atoms, the remaining atoms being selected from the group consisting of hydrogen, chlorine, and fluorine atoms.

16. The mixture of claim 9 wherein said additive comprises at least one bromine-containing aromatic compound and containing one or more bromine atoms and six to twelve carbon atoms, the remaining atoms being selected from the group consisting of hydrogen, chlorine, and fluorine atoms.

* * * * *